United States Patent
Davis et al.

(10) Patent No.: US 7,350,315 B2
(45) Date of Patent: Apr. 1, 2008

(54) EDGE WHEEL DRY MANIFOLD

(75) Inventors: Glenn W. Davis, Milpitas, CA (US); Carl Woods, Aptos, CA (US); John Parks, Hercules, CA (US); Fred C. Redeker, Fremont, CA (US); Mike Ravkin, Sunnyvale, CA (US); Michael L. Orbock, Beaverton, OR (US)

(73) Assignee: Lam Research Corporation, Fremont, CA (US)

(*) Notice: Subject to any disclaimer, the term of this patent is extended or adjusted under 35 U.S.C. 154(b) by 196 days.

(21) Appl. No.: 10/745,219

(22) Filed: Dec. 22, 2003

(65) Prior Publication Data

US 2005/0132953 A1    Jun. 23, 2005

(51) Int. Cl.
*F26B 13/30* (2006.01)
*B08B 5/04* (2006.01)

(52) U.S. Cl. .............. 34/92; 134/21; 134/95.2

(58) Field of Classification Search ............... 34/312, 34/317, 361, 406, 92, 58, 60, 71, 616, 658, 34/191, 660; 118/20, 715, 58; 134/21, 95.2
See application file for complete search history.

(56) References Cited

U.S. PATENT DOCUMENTS

| 4,838,289 | A | | 6/1989 | Kottman et al. |
| 4,921,093 | A | * | 5/1990 | Peters et al. ............ 198/471.1 |
| 4,968,375 | A | | 11/1990 | Sato et al. |
| 5,084,134 | A | | 1/1992 | Mattiussi et al. |
| 5,088,441 | A | * | 2/1992 | Bell ............................ 118/67 |
| 5,271,774 | A | | 12/1993 | Leenaars et al. |
| 5,620,525 | A | | 4/1997 | Van de Ven et al. |
| 5,660,642 | A | | 8/1997 | Britten |
| 5,705,223 | A | | 1/1998 | Bunkofske |
| 5,724,748 | A | | 3/1998 | Brooks et al. |
| 5,729,856 | A | * | 3/1998 | Jang et al. ................ 15/88.1 |
| 5,868,857 | A | | 2/1999 | Moinpour et al. |
| 5,945,351 | A | | 8/1999 | Mathuni |
| 5,967,882 | A | | 10/1999 | Duescher |
| 5,997,653 | A | | 12/1999 | Yamasaka |
| 6,012,192 | A | | 1/2000 | Sawada et al. |

(Continued)

FOREIGN PATENT DOCUMENTS

EP    0905746 A1    3/1999

(Continued)

OTHER PUBLICATIONS

U.S. Appl. No. 10/882,934, filed Jun. 2004, Garcia et al.

(Continued)

*Primary Examiner*—Kenneth Rinehart
(74) *Attorney, Agent, or Firm*—Martine, Penilla & Gencarella, LLP (57) ABSTRACT

A apparatus for drying a substrate includes a vacuum manifold positioned adjacent to an edge wheel. The edge wheel includes an edge wheel groove for receiving a peripheral edge of a substrate, and the edge wheel is capable of rotating the substrate at a desired set velocity. The vacuum manifold includes a proximity end having one or more vacuum ports defined therein. The proximity end is positioned at least partially within the edge wheel groove, and using supplied vacuum removes fluids that accumulate in the edge wheel groove and prevents re-deposit of trapped fluids around the peripheral edge of the substrate.

21 Claims, 10 Drawing Sheets

U.S. PATENT DOCUMENTS

| | | |
|---|---|---|
| 6,035,549 A | 3/2000 | Chevalier et al. |
| 6,102,777 A | 8/2000 | Duescher et al. |
| 6,398,975 B1 | 6/2002 | Mertens et al. |
| 6,491,764 B2 | 12/2002 | Mertens et al. |
| 6,550,091 B1 * | 4/2003 | Radman et al. .............. 15/77 |
| 6,622,334 B1 | 9/2003 | Ziemins et al. |
| 6,672,341 B2 | 1/2004 | Batholomew et al. |
| 7,000,622 B2 | 2/2006 | Woods et al. |
| 7,089,687 B2 | 8/2006 | Parks |
| 2002/0121290 A1 | 9/2002 | Tang et al. |
| 2002/0125212 A1 | 9/2002 | Mertens et al. |
| 2005/0132953 A1 | 6/2005 | Davis et al. |
| 2006/0000494 A1 | 1/2006 | Garcia et al. |

FOREIGN PATENT DOCUMENTS

| | | |
|---|---|---|
| EP | 1 372 186 | 10/2000 |
| WO | WO-99/16109 A1 | 4/1999 |
| WO | WO-02/101795 A2 | 12/2002 |

OTHER PUBLICATIONS

U.S. Appl. No. 11/395,893, filed Mar. 2006, Parks.

* cited by examiner

EDGE WHEEL DRY MANIFOLD

BACKGROUND OF THE INVENTION

1. Field of the Invention

The present invention relates generally to substrate cleaning and drying, and more specifically to techniques, systems, and apparatus for preventing fluid deposit and accumulation on substrate surfaces during fabrication processes involving substrates such as a semiconductor wafer, a hard disk, a Liquid Crystal Display (LCD), or a Flat Display Panel (FDP).

2. Description of the Related Art

In a manufacturing processes for fabricating a semiconductor device, an LCD, a magnetic disk, an FDP, etc., there is a need to perform wet cleaning of substrates at various stages of the fabrication process. By way of example, integrated circuit devices are typically manufactured in the form of multi-level structures. At the substrate level, transistor devices having diffusion regions are formed over and into silicon substrates. In subsequent levels, interconnect metallization lines are patterned and electrically connected to the transistor devices to define the desired functional device. As is well known, patterned conductive layers are insulated from other conductive layers by dielectric materials, such as silicon dioxide. At each metallization level there is a need to planarize metal or associated dielectric material. In some applications, metallization line patterns are defined in the dielectric material, and then chemical mechanical planarization (CMP) operations are performed to remove excess metallization.

Following each CMP operation, a wet clean of the substrate is typically performed. The wet clean is designed to wash away any by-products of the fabrication process, remove contaminants, and to achieve and maintain the necessary degree of cleanliness essential to proceed to a subsequent fabrication operation. As transistor device structures become smaller and more complex, the precision required to achieve and maintain structure definition demands exacting standards of cleanliness be maintained in all process operations. If a wet clean is incomplete or ineffective, or if a post-wet clean drying is incomplete or ineffective, then unacceptable residue or contaminants are introduced into the processing environment, potentially comprising the integrity of the devices being fabricated.

Several substrate drying operations and techniques are employed for post-wet clean and other substrate drying, and include such processes as spin drying and the plurality of spin drying variations, configurations, and techniques. In a typical spin dry process, a liquid rinsing or cleaning agent, with or without a surface tension reducing drying agent, is applied to and removed from the surface of a substrate by spinning the substrate and using centrifugal force to dry the substrate.

Figure 1:
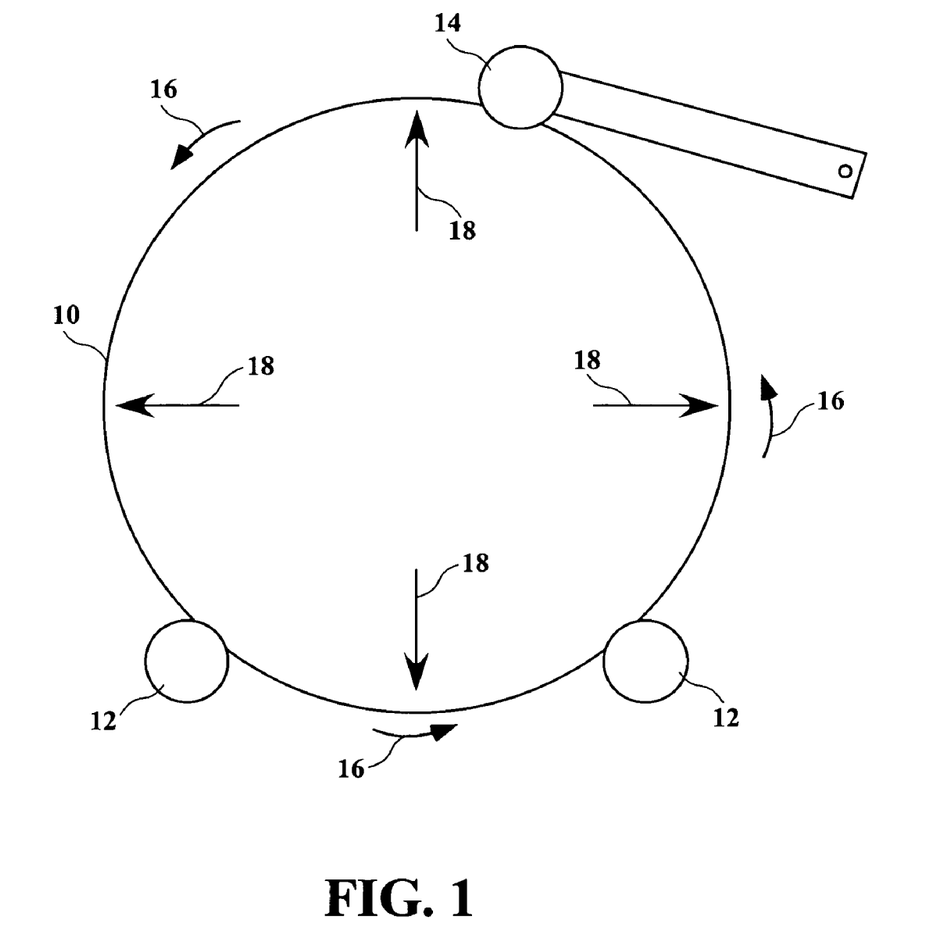
FIG. 1 illustrates surface removal of fluids from a substrate using a spin dry technique.

FIG. 1 illustrates surface removal of fluids from a substrate 10 using a spin dry technique. The typically horizontally oriented substrate 10, having both an active surface and a backside surface to be spun dry, is positioned in a spin/dry, or a spin-rinse-dry (SRD) apparatus having one or more fixed edge wheels 12, and a stabilizer edge wheel 14. Substrate 10 is rotated 16 resulting in rinsing and drying agents, liquids, or any other fluids being driven from the surfaces of the substrate 10 by centrifugal force as indicated by fluid flow directional arrows 18.

Although such drying techniques as spin drying and Marangoni/Spin drying are generally effective for substrate drying, a notable exception to this effectiveness exists at the substrate edge. As fluids are driven 18 from the surface of the substrate 10, some fluid can be captured and trapped in fixed edge wheels 12 and stabilizer edge wheel 14, and re-deposited along edge of substrate 10 as it is spun.

Due to the exacting requirements of current and evolving substrate fabrication processes, complete and effective drying is highly desirable, but rarely achieved with current apparatus and techniques. What is needed are systems, techniques, and apparatus for complete and effective edge drying of substrates which eliminate the accumulation and re-depositing of fluids on a substrate edge.

SUMMARY OF THE INVENTION

Broadly speaking, the present invention fills these needs by providing an apparatus for drying a substrate that includes removing fluids from an edge wheel groove in SRD systems. The present invention can be implemented in numerous ways, including as a process, an apparatus, a system, a device, and a method. Several embodiments of the present invention are described below.

In one embodiment, an apparatus is provided. The apparatus includes an edge wheel having a groove defined by sidewalls of the edge wheel, and a vacuum manifold having a proximity end. The proximity end of the vacuum manifold is capable of being positioned adjacent to the groove of the edge wheel to enable removal of fluids from the edge wheel.

In another embodiment, an apparatus is provided. The apparatus includes an edge wheel having an edge wheel groove defined by sidewalls of the edge wheel; and a manifold having a proximity end. The proximity end of the manifold is capable of being positioned adjacent to the edge wheel groove to enable fluid communication with the edge wheel.

In a further embodiment, a method for holding a substrate edge is provided. The method includes receiving the substrate edge by at least one wheel having a groove, and vacuuming fluids from the groove of the at least one wheel when holding the substrate edge.

In yet another embodiment, an edge wheel drying manifold is provided. The edge wheel drying manifold includes an edge wheel having an edge wheel groove. The edge wheel groove is defined by sidewalls of the edge wheel. The edge wheel drying manifold further includes a manifold body, and a vacuum port defined in the manifold body. The manifold body is positioned adjacent to the edge wheel.

In still a further embodiment, a method for drying a substrate is provided. The method includes positioning a substrate in at least one substrate edge wheel. The at least one substrate edge wheel has an edge wheel groove for receiving a peripheral edge of the substrate. The method further includes rotating the substrate, and evacuating fluid from within the edge wheel groove.

The advantages of the present invention over the prior art are numerous. One notable benefit and advantage of the invention is the prevention of fluids being re-deposited around the periphery of a substrate during spin drying. Although SRD apparatus are and can be extremely effective for substrate drying and the removal of sources of residue on substrate surfaces, micro-dots of fluids, and corresponding residues, are consistently re-deposited around the periphery of a substrate positioned in edge wheels as the edge wheels accumulate and trap fluids expelled from the surface of a substrate during drying operations. Embodiments of the present invention provide for the removal of fluids which accumulate and are trapped in the groove of an edge wheel.

Removal of such fluids removes the source of fluid re-deposit and achieves superior substrate drying.

Another benefit is that embodiments of the present invention are easily implemented in existing systems and apparatus, as well as systems and apparatus currently being developed. Component parts are easily and inexpensively manufactured, and yield significant return in reduction of waste and precision of manufacture.

Other advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

An invention for substrate processing is described. In preferred embodiments, an edge wheel dry manifold is configured to be defined adjacent to an edge wheel in substrate drying apparatus, and is provided to evacuate fluids from within the edge wheel groove and to prevent the re-depositing of fluids on a peripheral edge of a substrate. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
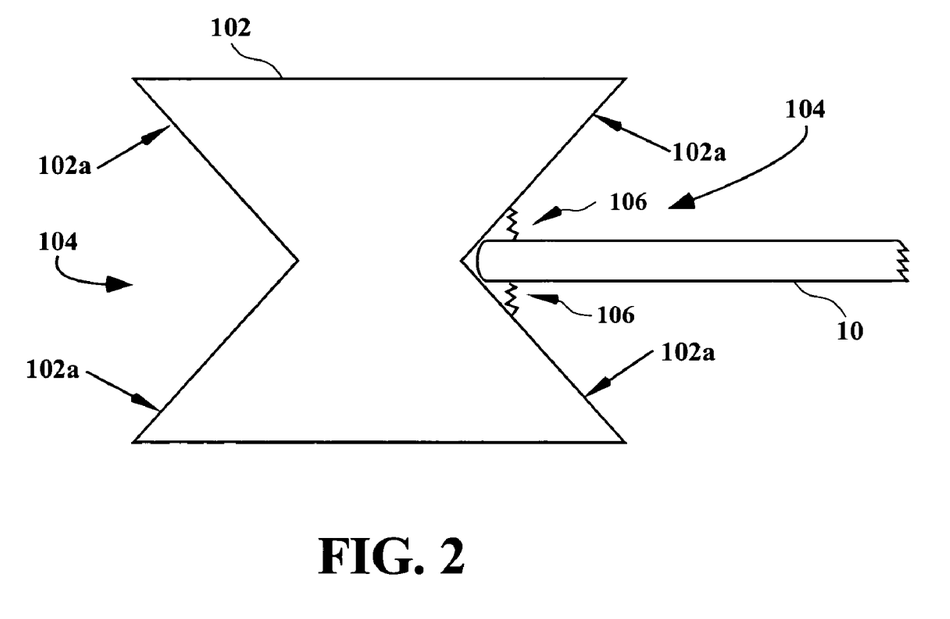
FIG. 2 shows an edge wheel having sidewalls that define an edge wheel groove in which is received a peripheral edge of a substrate.

As is known, one method of drying a substrate is by use of a spin/dry or SRD apparatus, herein after referred to collectively as an SRD apparatus. As described above in reference to FIG. 1, an SRD apparatus uses centrifugal force to drive fluids from both active and backside surfaces of a substrate. FIG. 2 illustrates how fluids are trapped and re-deposited along a peripheral edge of a substrate 10. FIG. 2 shows an edge wheel 102, having sidewalls 102a that define an edge wheel groove 104 in which is received a peripheral edge of a substrate 10. The edge wheel 102 can be a fixed edge wheel, a stabilizer edge wheel, or generally any type of edge wheel as might be implemented for substrate 10 processing. Edge wheel 102 typically serves to, e.g., position, support, and rotate substrate 10. Substrate processing, such as clean and dry operations, involves the rotation of a substrate 10, which is generally accomplished by the rotation of edge wheels 102. Peripheral edge of substrate 10 is received in edge wheel groove 104 such that rotation of edge wheel 102 imparts rotational force onto peripheral edge of substrate 10. As the substrate rotates, centrifugal force drives fluids from both active and backside surfaces of substrate 10, eventually forcing such fluid from the substrate 10 around the peripheral edge.

As fluids or liquids such as cleaning agents, rinsing agents, deionized water (DI water), or other chemistries in accordance with desired substrate processing are driven from the active and backside surfaces of substrate 10, such fluids can collect in the edge wheel groove 104. The trapped fluids, shown at 106 in FIG. 2, are funneled along sidewalls 102a to the apex of edge wheel groove 104, and can flow both above and below surfaces defining the peripheral edge of substrate 100. As substrate 10 is rotated by edge wheel 102, trapped fluids 106 can be re-deposited on active and backside surfaces around the periphery of substrate 10.

Figure 3:
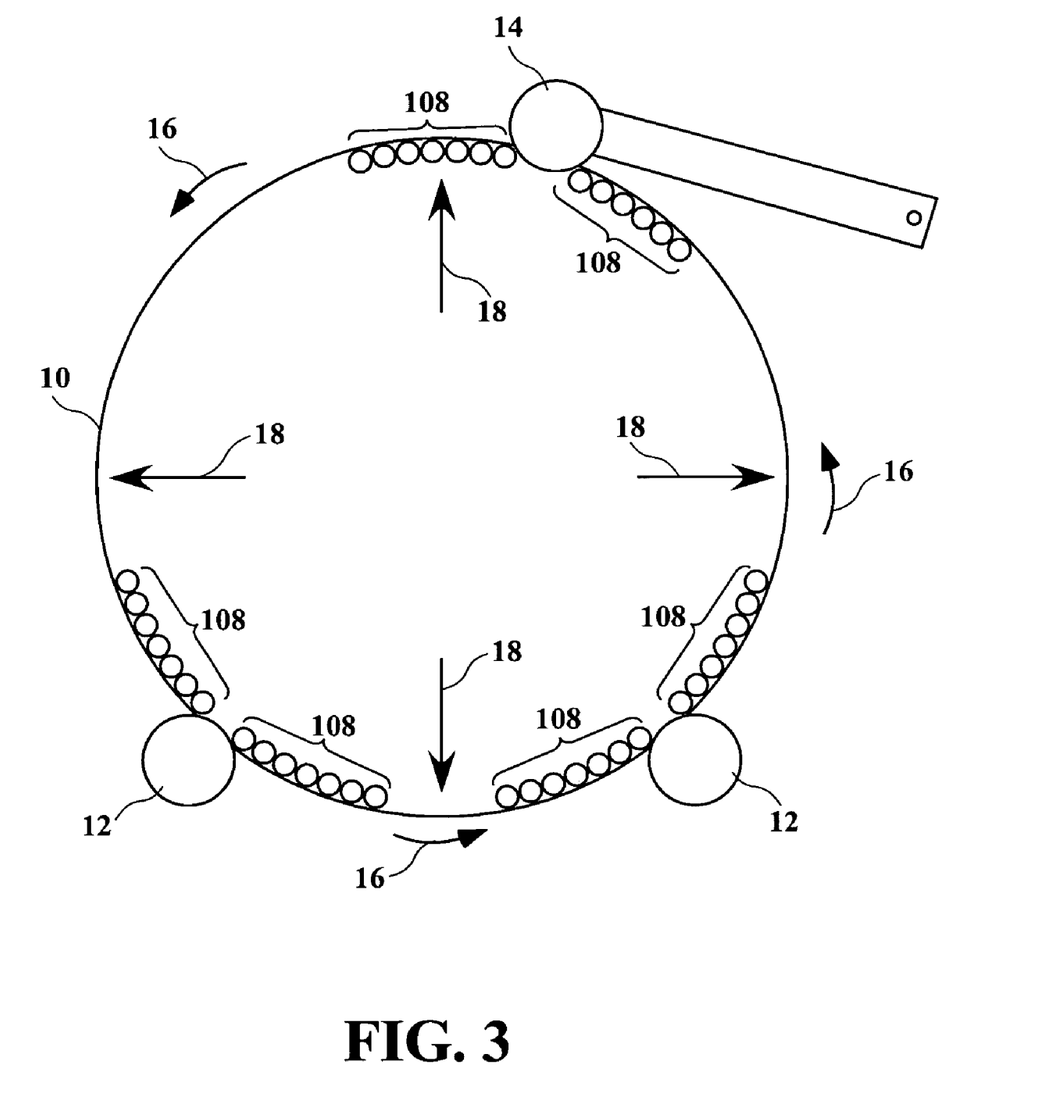
FIG. 3 illustrates the re-deposit of trapped fluids as micro-dots of fluid around the periphery of a substrate.

FIG. 3 illustrates the re-deposit of the trapped fluids 106 (see FIG. 2) as micro-dots 108 of fluid around the periphery of substrate 10. Exemplary micro-dots of fluid 108 are shown in FIG. 3 on the periphery of substrate 10 adjacent to fixed edge wheels 12 and stabilizer wheel 14, but it should be understood that the micro-dots of fluid 108 can be, and are, deposited at any point around the peripheral edge of substrate 10. Such micro-dots of fluid 108 represent undesirable incomplete drying of substrate 10.

Figure 4:
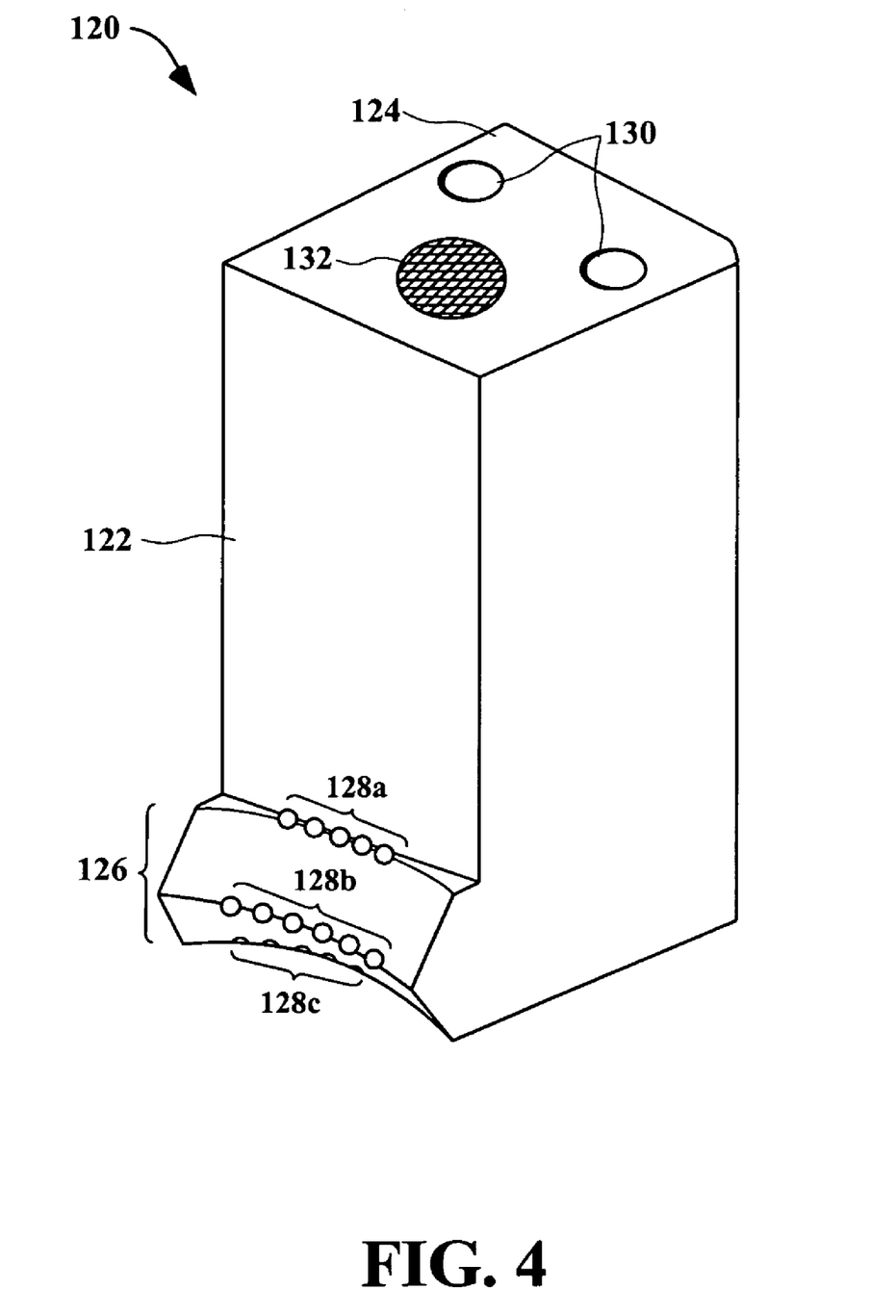
FIG. 4 illustrates an edge wheel dry manifold in accordance with one embodiment of the present invention.

FIG. 4 illustrates an edge wheel dry manifold 120 in accordance with one embodiment of the present invention. Edge wheel dry manifold 120 includes a manifold body 122 having an attachment end 124 and a proximity end 126. Proximity end 126 includes from one to a plurality of ports 128, which in one embodiment are vacuum ports, and in the illustrated embodiment include upper vacuum ports 128a, mid vacuum ports 128b, and lower vacuum ports 128c. In other embodiments, one or more ports are located in positions corresponding to one or more of the regions identified for upper vacuum ports 128a, mid vacuum ports 128b, and lower vacuum ports 128c, according to processing apparatus in which the edge wheel dry manifold 120 is implemented, processing requirements, etc. In one embodiment, ports 128 are plumbed through a central region or core of manifold body 122, the machining of which results in port bore plug 132 shown on attachment end 124.

In the illustrated embodiment, attachment end 124 connects to an arm such as a stabilizer arm (not shown) used for mounting and positioning a stabilizer wheel such as stabilizer wheel 14 shown in FIG. 1. Mounting holes 130 are provided for attaching edge wheel dry manifold 120 to a stabilizer arm in the embodiment illustrated in FIG. 4, but as illustrated and described below, edge wheel dry manifold 120 is variously configured for a plurality of mounting configurations according to the desired implementation, SRD apparatus, etc.

In one embodiment of the invention, edge wheel dry manifold 120 is constructed of materials such as plastics (e.g., PET, PEAK, etc.), or other such material that is easy to machine, readily available, relatively inexpensive, and appropriate for use in clean environments (e.g., cleanroom environments), as well as being resistant to corrosion and to the corrosive effects of the plurality of chemistries that may require cleaning from the surface of a semiconductor wafer or other substrate.

In one embodiment of the invention, proximity end 126 includes one or more ports 128, and is formed to be positioned adjacent to and at least partially within edge wheel groove 104 (see FIG. 2). As can be seen in FIG. 2, edge wheel groove 104 is formed by sidewalls 102*a*. In one embodiment of the present invention, proximity end 126 is shaped to align with sidewalls 102*a*, allowing proximity end 126 to essentially conform to the shape of, and to be positioned at least partially within edge wheel groove 104.

Figure 5:
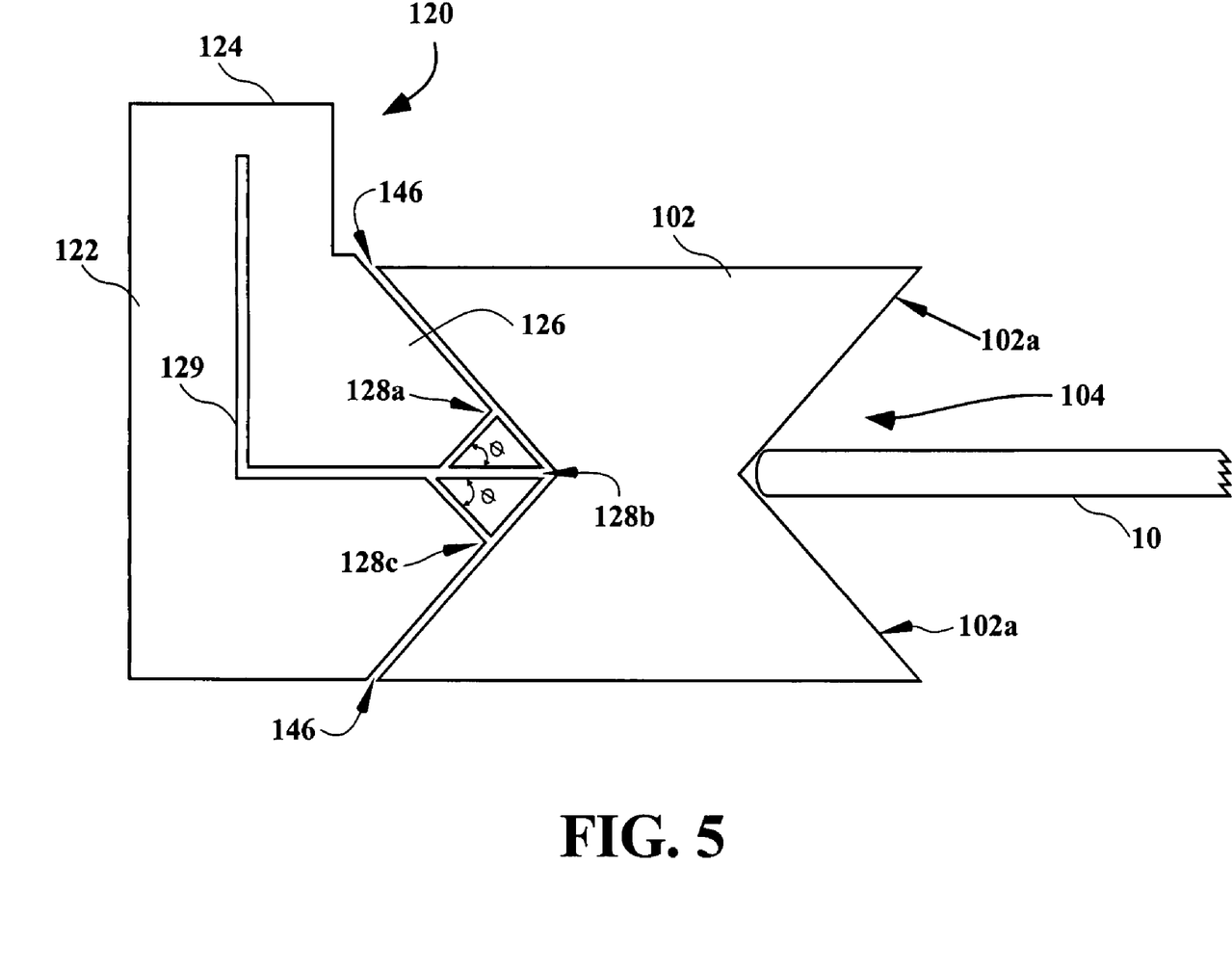
FIG. 5 shows a cross section view of an edge wheel dry manifold in accordance with one embodiment of the present invention.

FIG. 5 shows a cross section view of an edge wheel dry manifold 120 in accordance with one embodiment of the present invention. In the illustrated embodiment, edge wheel dry manifold 120 is positioned adjacent to edge wheel 102, and at least partially within edge wheel groove 104. Proximity end 106 is formed to essentially conform to the surfaces of sidewalls 102*a*. Opposite proximity end 126, substrate 10 is shown positioned in edge wheel groove 104, illustrating essentially an operational state of a substrate drying apparatus. An operational clearance 146 is maintained during processing between proximity end 126, and edge wheel sidewalls 102*a* defining edge wheel groove 104. In one embodiment of the invention, edge wheel dry manifold 120 is fully adjustable to establish and maintain a consistent, desirable operational clearance 146. Additional detail regarding operational clearance 146, and edge wheel dry manifold 120 adjustment is provided below in reference to FIGS. 6 and 7.

In the embodiment illustrated in FIG. 5, three vacuum port 128 locations are shown, including upper vacuum port 128*a*, mid vacuum port 128*b*, and lower vacuum port 128*c*. At each vacuum port 128 location, from one to a plurality of vacuum ports 128 may be provided. In other embodiments, one or more vacuum port 128 locations (e.g., upper, mid, and lower) may be eliminated with vacuum ports 128 provided, e.g., only at mid vacuum port 128*b* and/or lower vacuum port 128*c* locations. In the illustrated embodiment having upper vacuum ports 128*a*, mid vacuum ports 128*b*, and lower vacuum ports 128*c*, angle θ defines the placement of vacuum ports 128. In one embodiment, mid vacuum port 128*b* is defined at an angle of zero degrees, in the apex of proximity end 126. Upper vacuum ports 128*a* and lower vacuum ports 128*c*, if configured, are defined relative to the zero degree angle of mid vacuum ports 128*b*, or to the apex of proximity end 126 if no mid vacuum ports 128*b* are configured, and angle θ can range from about 10 degrees to about 60 degrees, in one embodiment, and in one embodiment, angle θ is about 45 degrees.

In one embodiment of the invention, vacuum is provided at vacuum ports 128 through plumbing constructed through the center or core of manifold body 122. In the illustrated embodiment, vacuum bore 129 runs through the central region or core of manifold body 122, eventually branching out to vacuum ports 128*a*, 128*b*, and 128*c*. Vacuum bore 129 may be constructed in accordance with known manufacturing methods and techniques, including drilling or boring a central line through manifold body, boring or drilling a manifold line across proximity end 126, and punching vacuum ports 128 as desired through proximity end 126 to central and/or manifold lines. In one embodiment, vacuum bore plugs (see for example, 132 in FIG. 4) are then provided to seal the vacuum plumbing access as necessary.

In one embodiment of the present invention, the central region or core of manifold body 122 is plumbed for fluid delivery (not shown) in addition to fluid removal. In accordance with known manufacturing methods and techniques, two or more lines (not shown) are constructed within manifold body 122 to enable the delivery of fluids, air, vapors, or gas, in addition to vacuum for removing fluids, as well as removing or evacuating air, vapors, gas, etc.

Figure 6:
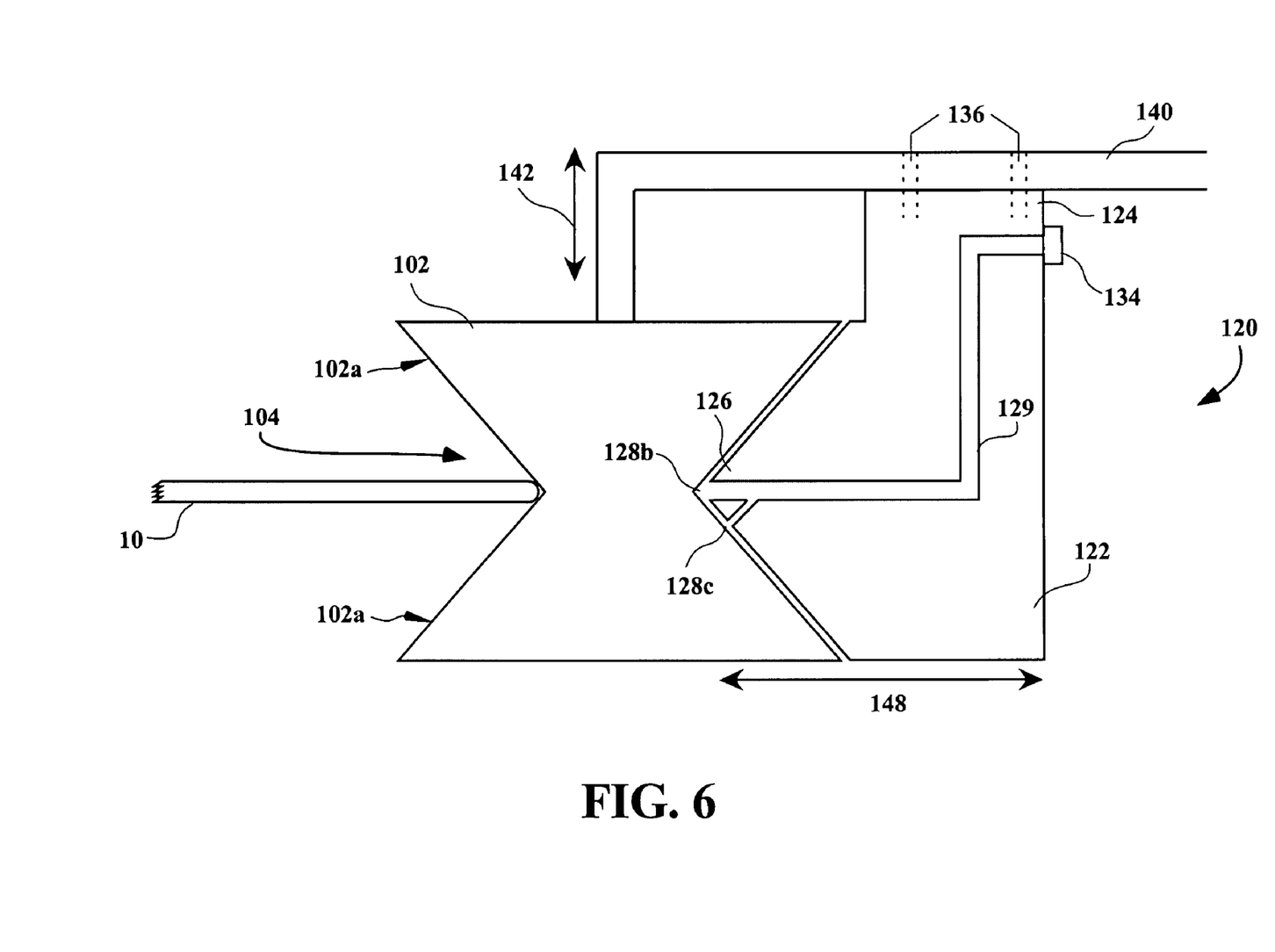
FIG. 6 shows a cross-section view of edge wheel dry manifold in accordance with an embodiment of the present invention.

FIG. 6 shows a cross-section view of edge wheel dry manifold 120 in accordance with an embodiment of the present invention. FIG. 6 shows an edge wheel dry manifold 120 having a manifold body 122 including an attachment end 124 and a proximity end 126. Edge wheel dry manifold 120 is shown in an operational position adjacent to edge wheel 102, with proximity end 126 at least partially within edge wheel groove 104 and adjacent to sidewalls 102*a* which define edge wheel groove 104. In the illustrated embodiment, mid vacuum ports 128*b* and lower vacuum ports 128*c* are provided, and connected by vacuum bore 129 to a vacuum fitting 134, to which is connected a vacuum supply (not shown).

In the illustrated embodiment, edge wheel dry manifold 120 is attached to stabilizer arm 140, which also provides mounting and positioning for edge wheel 102. Connectors 136, which can be screws, bolts, studs, locking pins, or any other known method of securely attaching mechanical components, attach edge wheel dry manifold 120 at attachment end 124 to stabilizer arm 140. In one embodiment, connectors 136 secure edge wheel dry manifold 120 to stabilizer arm 140 at mounting holes 130 (see FIG. 4). It should be appreciated that, although edge wheel dry manifold 120 illustrated in FIG. 6 is configured to a stabilizer edge wheel 102, edge wheel dry manifold 120 is configurable for, and intended to be provided with any type of edge wheel 102. Edge wheels 102 identified as stabilizing or fixed are exemplary, and should not be interpreted as limiting or exclusive.

In one embodiment of the present invention, edge wheel 102 is adjustable to maintain accurate positioning of substrate 10. By way of example, substrate 10 is shown in a typical horizontal orientation, and it should be appreciated that edge wheel 102 may require adjustment in a vertical direction, up or down, and illustrated by directional arrow 142, to maintain desired alignment, orientation, and secure positioning of substrate, and enabling rotation. In one embodiment of the invention, connectors 136, and mounting holes 130 (see FIG. 4) enable corresponding vertical adjustment (e.g., adjustment in a vertical direction, up or down, as indicated by directional arrow 142) for edge wheel dry manifold 120 to maintain proper alignment between proximity end 126 and edge wheel groove 104. Further, in one embodiment, mounting holes (not shown) through stabilizer arm 140 are slotted to enable lateral or horizontal adjustment, represented by directional arrow 148. Additional details about edge wheel dry manifold 120 adjustments are provided below in reference to FIG. 7.

Figure 7:
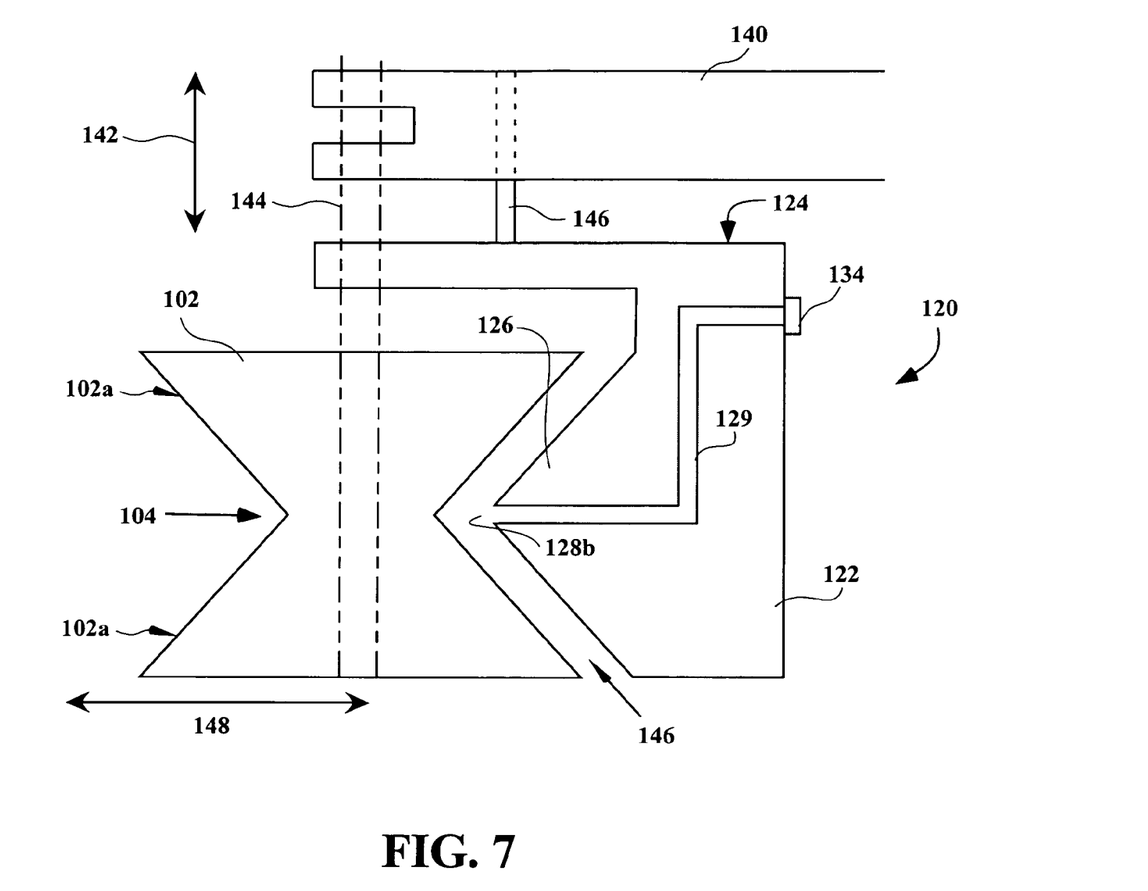
FIG. 7 shows a cross-section view of edge wheel dry manifold in accordance with one embodiment of the present invention.

FIG. 7 shows a cross-section view of edge wheel dry manifold 120 in accordance with one embodiment of the present invention. The embodiment illustrated in FIG. 7 includes a manifold body 122 having an attachment end 124 and a proximity end 126. Proximity end 126 is adjacent to edge wheel 102, and at least partially within edge wheel groove 104 defined by edge wheel sidewalls 102*a*. The illustrated embodiment includes a single mid vacuum port 128*b* location, connected by a vacuum bore 129 to a vacuum fitting 134, which provides for connection to a vacuum supply.

As described above in reference to FIG. 6, edge wheel 102 is typically adjustable in at least a vertical direction, illustrated by directional arrow 142, to achieve and maintain desired alignment for substrate 10 (see FIG. 6) positioning, and to enable high speed substrate 10 rotation. Accordingly, one embodiment of edge wheel dry manifold 120 is adjustable in at least the vertical plane represented by directional arrow 142, to achieve and maintain desired positioning and alignment of proximity end 126 relative to edge wheel groove 104. In the illustrated embodiment, edge wheel 102 is adjustably connected to stabilizer arm 140 with shaft 144. Similarly, in one embodiment, shaft 144 provides for adjustment of edge wheel dry manifold 120 in a vertical direction, as represented by directional arrow 142. Guide pin 146, extends from attachment end 124 into stabilizer arm 140 to maintain positioning, and to prevent displacement of edge wheel dry manifold 120 due to torsion or other forces acting upon manifold body 122.

In the embodiment illustrated in FIG. 7, a single vacuum port location, the mid vacuum port 128*b* is provided. As described above, vacuum ports can be configured to any desired location in the proximity end 126 in order to evacuate water, or any other fluids, vapors, gases, from edge wheel groove 104. At each location (upper 128*a*, mid 128*b*, and lower 128*c*, see FIG. 4) from one to a plurality of vacuum ports 128 may be provided. With vacuum applied at vacuum fitting 134, any water (or other fluid, vapor, or gas) in edge wheel groove 104 is removed through vacuum ports 128. In other embodiments (not illustrated) additional plumbing is provided through manifold body 122 to introduce fluids, gasses, or vapors as desired, for example, to rinse or clean edge wheel 102, or edge of substrate 10 (see FIG. 5). In one embodiment of the present invention, the number and location of ports 128, and whether such ports evacuate or introduce fluids, or gases, or vapors, corresponds to the implementation of the edge wheel dry manifold 120 as an apparatus used for drying, or an apparatus used for cleaning and drying.

As described above, one embodiment of the present invention is adjustable in a vertical direction, illustrated by directional arrow 142. Additionally embodiments of edge wheel dry manifold 120 are adjustable in a horizontal or lateral direction, illustrated by directional arrow 148. Adjustment of lateral positioning (not shown) is provided in one embodiment in order to maintain a desired operational clearance 146 between proximity end 126 and edge wheel sidewalls 102*a* that define edge wheel groove 104. In one embodiment, operational clearance 146 provides that surfaces of edge wheel dry manifold 120 and edge wheel 102 are not in direct contact, and a clearance 146 of approximately 0.015 inch is maintained. In other embodiments, operational clearance falls within a range of approximately 0.002 and 0.060 inch.

Figure 8:
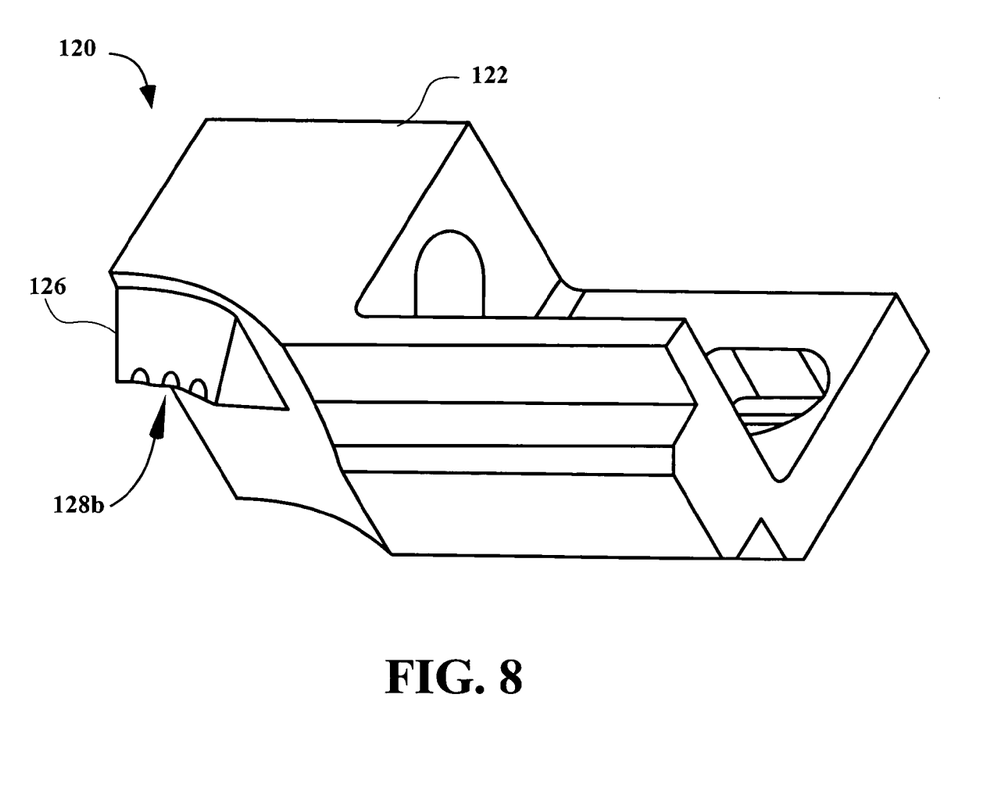
FIG. 8 shows an edge wheel dry manifold in accordance with another embodiment of the present invention.

FIG. 8 shows an edge wheel dry manifold 120 in accordance with another embodiment of the present invention. Edge wheel dry manifold 120 is intended for implementation in a plurality of cleaning and drying apparatus, and with a plurality of types and configurations of edge wheels. In the embodiment shown in FIG. 8, edge wheel dry manifold 120 includes a manifold body 122 having a proximity end 126 and mid vacuum ports 128*b*. FIG. 8 further illustrates that embodiments of edge wheel dry manifold 120 may be variously oriented in accordance with specific implementations, SRD apparatus, etc. In the illustrated embodiment, edge wheel dry manifold 120 may be implemented, by way of example, with a fixed edge wheel (not shown) with adjustment capabilities provided to achieve desired operational clearance, etc. (see FIG. 7).

Figure 9:
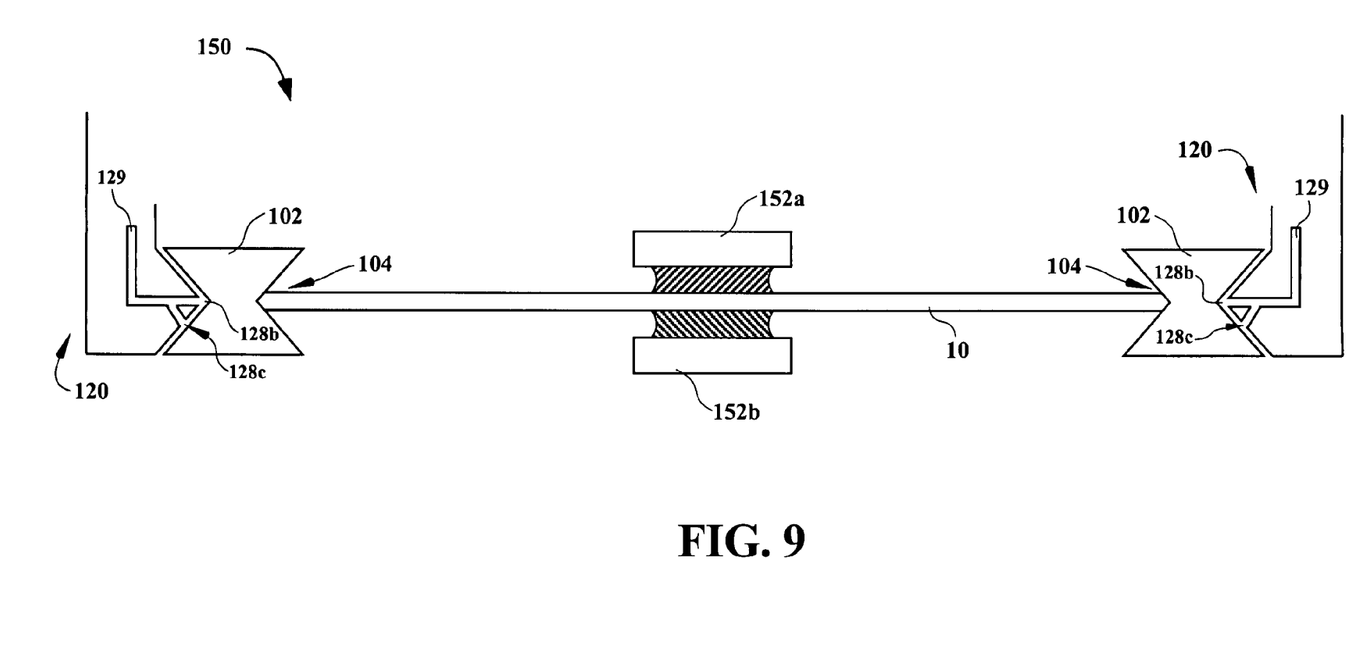
FIG. 9 illustrates an embodiment of the present invention implemented in a substrate processing system.

FIG. 9 illustrates an embodiment of the present invention implemented in a substrate processing system. FIG. 9 shows edge wheel dry manifold 120 implemented in a proximity head substrate processing system 150, in accordance with one embodiment of the present invention. A substrate 10 is positioned in a horizontal orientation in a proximity head substrate processing system 150. Substrate 10 is positioned in edge wheels 102, and each edge wheel is configured with an edge wheel dry manifold 120. Proximity heads 152*a* and 152*b* are shown tracking across active and backside surfaces of substrate 10.

In accordance with an embodiment of the present invention, substrate 10 is rotated and processed by proximity head substrate processing system 150. Although proximity head substrate processing systems 150 are exceptionally effective cleaning and/or rinsing and drying tools, a substrate is typically wet when inserted into the proximity head system 150. Therefore, when a substrate is rotated, existing liquids on the substrate are driven off of the surface of the substrate 10, regardless of the position or state of processing of the proximity heads 152*a*, 152*b*. Fluids can collect and remain trapped in edge wheel groove 104, and if not removed, can be re-deposited around the periphery of substrate 10. In the embodiment illustrated in FIG. 9, edge wheel dry manifold 120 is configured with at least one mid vacuum port 128*b* and at least one lower vacuum port 128*c*. Mid vacuum port 128*b* and lower vacuum port 128*c* are connected to vacuum by vacuum bore 129. The exceptional effectiveness of the proximity head substrate processing system 150 is maintained and enhanced with the implementation of an embodiment of the present invention to ensure fluids do not collect and are not re-deposited on substrate 10. Additional detail about proximity head substrate cleaning system 150 and methods of use can be found in co-pending U.S. patent application Ser. No. 10/261,839, filed on Sep. 30, 2002, and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES" which is hereby incorporated by reference for all purposes.

Figure 10:
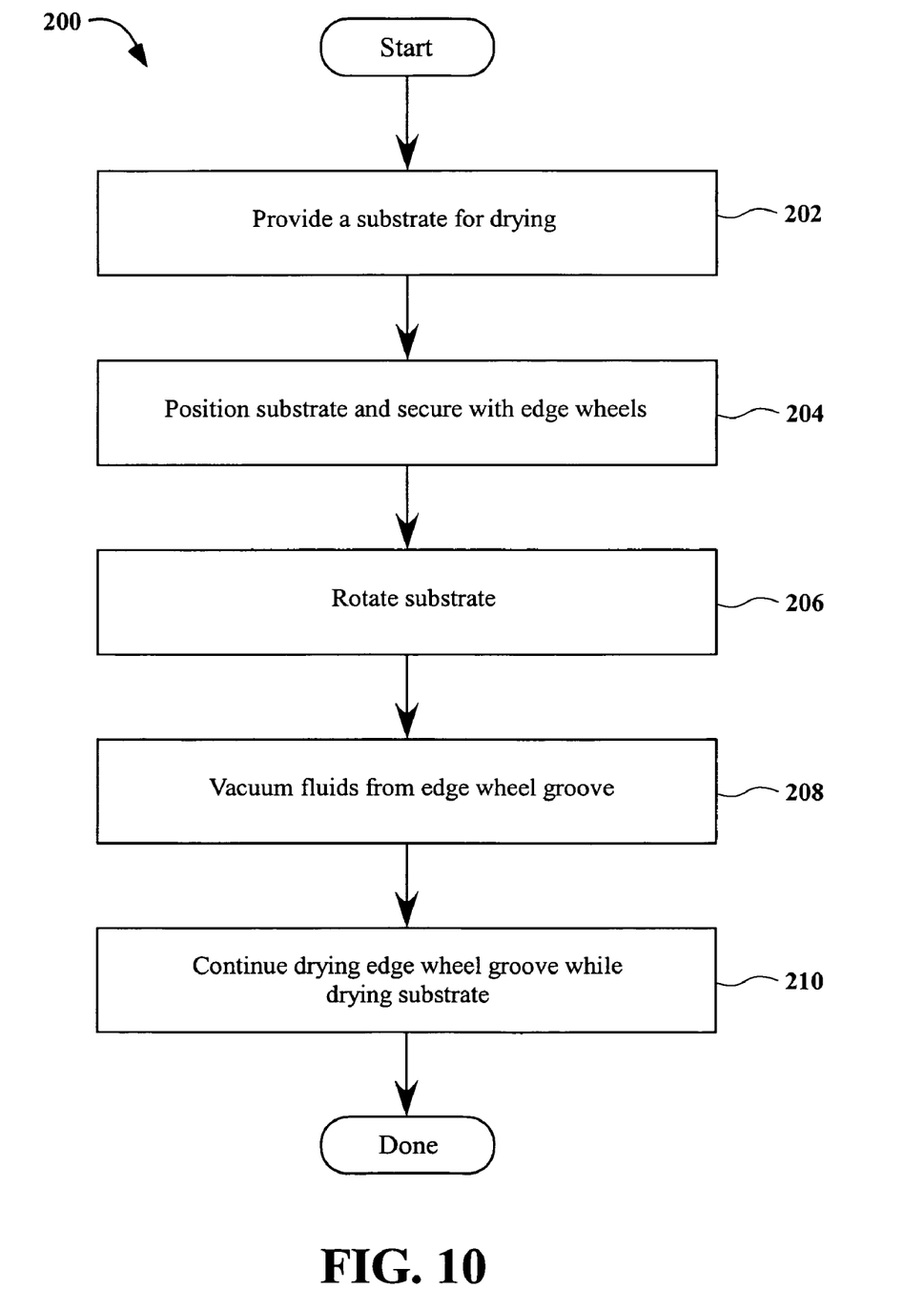
FIG. 10 is a flow chart diagram illustrating the method operations for substrate drying in accordance with an embodiment of the present invention.

FIG. 10 is a flow chart diagram 200 illustrating the method operations for substrate drying in accordance with an embodiment of the present invention. The method begins with operation 202 in which a substrate is received for drying. In one example, the substrate is a semiconductor wafer having a plurality of structures defined and in the process of being fabricated therein. The structures can be of any type that are usually fabricated in and on semiconductor wafers such as integrated circuits, memory cells, and the like. Other examples of substrates include hard disks, Liquid Crystal Displays, and Flat Display Panels. Typically, a substrate received for drying is received wet, following a wet clean, and the substrate is received for processing including drying the substrate, and may also include washing and/or rinsing in addition to drying the substrate. A substrate is typically received in a horizontal orientation, but depending on the configuration of the apparatus into which it is received, the substrate may be oriented horizontally, vertically, or in any orientation according to the configuration of the corresponding tool.

The method continues with operation 204 in which the substrate is positioned and secured with edge wheels. In the exemplary implementation, a substrate is received in an SRD apparatus which can be of various types and configurations, including a proximity cleaning and drying apparatus illustrated in FIG. 9. Existing SRD apparatus and SRD apparatus currently being developed position and secure a substrate with edge wheels, which are also used to rotate the substrate at desired set velocities during cleaning, rinsing, and drying. A substrate is therefore received and positioned in edge wheels, the edge wheels having edge wheel grooves defined by sidewalls of the edge wheel body into which, or against which, a peripheral edge of the substrate is inserted.

Next, in operation 206, the substrate is rotated. As described above, edge wheels are rotated or spun, and the rotation is imparted on the substrate edge, thereby rotating the substrate at a desired velocity. A desired velocity may be set or established and then maintained at the set velocity by the tool, and modified as desired according to processing needs. Rotational velocity generates the centrifugal force that is exploited in drying the substrate.

The method continues with operation 208 in which fluids are vacuumed from within the edge wheel groove. As described above, centrifugal and other forces drive fluids from active and backside surfaces of the substrate, with such fluids being expelled from the peripheral edge of the substrate. The expelled fluids can collect and become trapped in the edge wheel groove, and can then be re-deposited as micro-dots of fluid around the periphery of the substrate. Embodiments of the present invention are implemented to vacuum or evacuate the accumulated and/or trapped fluids within the edge wheel groove, preventing further accumulation, as well as re-depositing of fluids on the substrate.

The method concludes with operation 210 which describes the continuing of the cleaning, rinsing, and drying of the substrate. In one embodiment of the invention, the edge wheel manifold continues to vacuum or evacuate fluids from the edge wheel groove, and thereby maintain the edge wheel groove in a dry state, for as long as the substrate is rotated and processed in the apparatus. In other embodiments, the vacuuming of the edge wheel groove is implemented or cycled according to a defined schedule or regime in accordance with processing needs and goals. When the substrate has completed processing, and edge wheel drying no longer necessary, the method is done.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A processing system for processing a semiconductor wafer, the processing system comprising:
   a plurality of edge wheels, each of the edge wheels having a groove defined by sidewalls of the edge wheel, the plurality of edge wheels being positioned for receiving and securing the wafer; and
   a vacuum manifold disposed adjacent to each of the edge wheels, the vacuum manifold including a proximity end positioned within the groove, the proximity end being configured to conform to the shape of the groove to remove fluids from the groove of the edge wheel,
   wherein the proximity end is positioned to maintain an operational clearance in a range of 0.002 inch to 0.06 inch between the proximity end and the groove.

2. The processing system of claim 1, wherein the vacuum manifold comprises a vacuum port the vacuum port being configured for removing fluids from the groove of the edge wheel.

3. The processing system of claim 1, wherein the vacuum manifold comprises a plurality of vacuum ports, the plurality of vacuum ports being defined adjacent to the groove of the edge wheel.

4. The processing system of claim 1, further comprising a vacuum supply, the vacuum supply providing vacuum to remove fluids from the edge wheel.

5. The processing system of claim 1, wherein a peripheral edge of the wafer is received in the groove of each of the edge wheels.

6. The processing system of claim 5, wherein the edge wheels are rotated and rotation of the edge wheels is imparted to the peripheral edge of the wafer, thereby rotating the substrate.

7. A processing system for processing a semiconductor wafer, the processing system comprising:
   a plurality of edge wheels, each of the edge wheels having a groove defined by sidewalls of the edge wheel, the edge wheels being positioned to rotationally support the semiconductor wafer by the grooves of the edge wheels; and
   a manifold disposed adjacent to each of the edge wheels, each manifold having a proximity end positioned within the groove of the edge wheel, the proximity end conforming to the shape of the groove of the edge wheels, and the proximity end being configured to maintain an operational clearance in a range of 0.002 inch to 0.06 inch between the proximity end and the edge wheel,
   wherein the proximity end removes fluids from the groove of the edge wheel using a vacuum port.

8. The processing system of claim 7, wherein the manifold includes a plurality of ports for removing fluids from the groove of the edge wheel.

9. The processing system of claim 7, wherein the groove is capable of receiving an edge of a semiconductor wafer.

10. A method for holding an edge of a semiconductor wafer, the method comprising:
   receiving the edge of the semiconductor wafer by at least three edge wheels each having a groove; and
   vacuuming fluids from each of the grooves of the edge wheels, while the semiconductor wafer is held by the grooves of the edge wheels,
   wherein the vacuuming of fluids from each of the grooves includes,
   providing an edge wheel drying manifold that includes a proximity end conforming to the shape of the grooves of the edge wheels;
   positioning the proximity end of the edge wheel drying manifold adjacent to and partially within the grooves of each of the edge wheels, the positioning including maintaining an operational clearance in a range of 0.002 inch to 0.06 inch between the proximity end and at least one edge wheel;
   providing vacuum to the edge wheel drying manifold, the vacuum removing fluids from the groove of the wheels; and
   rotating the wheels, the rotating of the wheels imparting rotation to the semiconductor wafer, wherein the vacuum provided to the edge wheel drying manifold removes fluid from the grooves of each of the edge wheels.

11. The method of claim 10, wherein the edge wheel drying manifold includes a vacuum port defined in the proximity end.

12. The method of claim 10, wherein the edge wheel drying manifold includes a plurality of vacuum ports defined in the proximity end.

13. The method of claim 10, wherein the operating clearance is 0.015 inch.

14. A spin, rinse, and dry (SRD) module of a semiconductor wafer processing apparatus, the SRD module comprising:
   three edge wheels each having a groove, the groove being defined by sidewalls of the edge wheel, the edge wheels being positioned for receiving a semiconductor wafer;
   a manifold body associated with each of the edge wheels, the manifold body including a proximity end configured to conform to the shape of the edge wheels, the proximity end being positioned to maintain an operational clearance in a range of 0.002 inch to 0.06 inch between the proximity end and the edge wheels; and
   a vacuum port defined in the proximity end of the manifold body,
   wherein the manifold body is positioned adjacent to the edge wheel, such that the vacuum port is positioned for removing fluids from the groove.

15. The SRD module of claim 14, wherein the manifold body includes a proximity end, the proximity end being positioned at least partially within the groove.

16. The SRD module of claim 14, wherein the manifold body is constructed of plastic.

17. The SRD module of claim 14, wherein the manifold body includes a vacuum bore defined within a core of the manifold body, the vacuum bore connecting the vacuum port to a vacuum supply.

18. A method for drying a semiconductor wafer, the method comprising:
   positioning the semiconductor wafer in a groove formed in a peripheral edge of an edge wheel, the groove thereby receiving a peripheral edge of the semiconductor wafer;
   providing an edge wheel manifold adjacent to the edge wheel, the edge wheel manifold having a proximity end configured to remove fluid from the groove using suction, the proximity end being configured to conform to the shape of the groove, and the proximity end being positioned to maintain an operational clearance in a range of 0.002 inch to 0.06 inch between the proximity end and the groove;
   rotating the semiconductor wafer; and
   vacuuming fluid from the groove using the proximity end of the edge wheel manifold.

19. The method of claim 18, wherein at least one vacuum port is defined in the proximity end, the vacuuming comprising supplying suction to the at least one vacuum port.

20. The method of claim 19, wherein a plurality of vacuum ports is defined in the proximity end.

21. The method of claim 18, wherein the edge wheel is capable of rotating the semiconductor wafer at a set velocity.

* * * * *